United States Patent [19]
Korzekwa et al.

[11] Patent Number: 5,434,128
[45] Date of Patent: Jul. 18, 1995

[54] SUPERCONDUCTIVE WIRE

[75] Inventors: David A. Korzekwa, Los Alamos; John F. Bingert, Jemez Springs; Dean E. Peterson, Los Alamos; Haskell Sheinberg, Santa Fe, all of N. Mex.

[73] Assignee: The United States Department of Energy, Washington, D.C.

[21] Appl. No.: 168,331

[22] Filed: Dec. 17, 1993

Related U.S. Application Data

[63] Continuation of Ser. No. 856,427, Mar. 23, 1992, abandoned.

[51] Int. Cl.$^6$ .............................................. H01L 39/24
[52] U.S. Cl. ................................... 505/430; 29/599; 264/104; 505/432; 505/433; 505/500
[58] Field of Search ................ 156/155, 156; 264/104, 264/209.4, 299; 505/230, 232, 236, 237, 239, 430, 432, 433, 500; 29/599; 174/15.4, 125.1

[56] References Cited

U.S. PATENT DOCUMENTS

| | | | |
|---|---|---|---|
| 3,293,008 | 12/1966 | Allen et al. | 29/599 |
| 3,760,495 | 9/1973 | Meyer | 264/104 X |
| 3,769,085 | 10/1973 | Matsubara | 264/104 X |
| 4,397,081 | 8/1983 | Ziemek et al. | 29/599 |
| 4,857,675 | 8/1989 | Marancik et al. | 29/599 X |
| 4,877,768 | 10/1989 | Ziolo | 505/1 |
| 4,885,273 | 12/1989 | Sugimoto et al. | 505/1 |
| 4,952,554 | 8/1990 | Sungho Jin et al. | 505/1 |
| 4,983,576 | 1/1991 | Sedeaki Hagino et al. | 505/1 |
| 5,044,406 | 9/1991 | Yamazaki | 505/230 X |
| 5,143,897 | 9/1992 | Ziemek et al. | 29/599 X |
| 5,168,127 | 12/1992 | Kohno et al. | 174/125.1 |
| 5,284,823 | 2/1994 | Chou et al. | 505/430 X |

FOREIGN PATENT DOCUMENTS 2108635 8/1972 Germany ................ 29/599

*Primary Examiner*—Joseph M. Gorski
*Attorney, Agent, or Firm*—Bruce H. Cottrell; William A. Eklund; William R. Moser

[57] ABSTRACT

A superconductive article is made by inserting a rigid mandrel into an internal cavity of a first metallic tube, said tube having an interior surface and an exterior surface, said interior surface defining the interior cavity, forming a layer of a superconductive material or superconductive precursor upon the exterior surface of said first metallic tube, machining the layer of superconductive material or superconductive precursor to a predetermined diameter to form an intermediate article configured for insertion into a second metallic tube having an interior diameter corresponding to the predetermined diameter, inserting the machined intermediate article into a second metallic tube having an internal diameter corresponding to the predetermined diameter of the intermediate article to form a composite intermediate article, reducing or ironing the composite intermediate article to a predetermined cross-sectional diameter, and sintering the reduced or ironed composite intermediate article at temperatures and for time sufficient for the superconductive material or superconductive precursor to exhibit superconductivity.

16 Claims, 2 Drawing Sheets

SUPERCONDUCTIVE WIRE

This invention is the result of a contract with the Department of Energy (Contract No. W-7405-ENG-36).

This application is a continuation of U.S. application Ser. No. 07/856,427, filed on Mar. 23, 1992, and now abandoned.

FIELD OF THE INVENTION

The present invention relates to the field of superconductive articles, e.g., superconductive tapes or wires, and to a process of making such superconductive articles.

BACKGROUND OF THE INVENTION

The discovery of high temperature superconductive materials in the late 1980's was soon followed by a desire to form such materials into wires, tapes or similar shapes. Ideally, such wires or tapes should be physically strong, flexible, highly conductive and able to withstand strong magnetic fields without loss of current carrying capacity.

Processes generally referred to as "powder in a tube" have been developed. One example is U.S. Pat. No. 4,983,576, by Hagino et al., which describes a general process of fabricating superconductive wire by initially preparing a superconductive powder, filling a tube or pipe of silver with the superconductive powder, sealing the pipe or tube, subjecting the pipe or tube to drawing operations to form wire, and finally sintering the drawn wire.

Unfortunately, the resultant wires and tapes do not always have all the desired properties such as, e.g., high current capacity together with good mechanical properties such as crack resistance. It can also be desirable in some applications to have a channel or cavity within the wire or tape thereby allowing for the passage of a cryogenic coolant.

Accordingly, it is an object of this invention to provide a superconductive article in the form of a wire or tape, said superconductive article having an inner cavity for passage of coolant.

Another object of the invention is to have a tubular-type geometry thereby providing a more rigid superconductive article.

Still another object of the invention is to have a superconductive material in a tubular-type geometry whereby such geometry reduces field dependence of the superconductive material.

It is a further object of this invention to provide a method of fabricating such a superconductive article having a tubular-type geometry.

SUMMARY OF THE INVENTION

To achieve the foregoing and other objects, and in accordance with the purposes of the present invention, as embodied and broadly described herein, the present invention provides a superconductive article including a first metallic tube having an interior surface and an exterior surface, said interior surface defining an interior hollow cavity, a layer of superconductive material surrounding said exterior surface of said first metallic tube, and, a second metallic tube having an interior surface and an exterior surface, said interior surface adjacent to said layer of superconductive material.

The present invention further provides a process of making a superconductive article including forming a composite intermediate article including a first metallic tube having an interior surface and an exterior surface, said interior surface defining an interior hollow cavity, a second metallic tube having an interior surface and an exterior surface, and a layer of superconductive material or superconductive precursor sandwiched between the exterior surface of the first metallic tube and the interior surface of the second .metallic tube, ironing the composite intermediate article to a predetermined cross-sectional diameter, and sintering the ironed composite intermediate article at temperatures and for time sufficient for the superconductive material or superconductive precursor to exhibit superconductivity. The forming of the composite intermediate article can be accomplished by inserting a rigid mandrel into an internal cavity of a first metallic tube, said tube having an interior surface and an exterior surface, said interior surface defining the interior cavity, forming a layer of a superconductive material or superconductive precursor upon the exterior surface of said first metallic tube, machining the layer of superconductive material or superconductive precursor to a predetermined diameter to form an intermediate article configured for insertion into a second metallic tube having an interior diameter corresponding to the predetermined diameter, and inserting the machined intermediate article into a second metallic tube having an internal diameter corresponding to the predetermined diameter of the intermediate article to form the composite intermediate article or by forming a layer of superconductive material or precursor upon the interior surface of the second metallic tube, machining the layer of superconductive material or precursor to a predetermined diameter to form an intermediate article configured for insertion of the first metallic tube having an exterior diameter corresponding to the predetermined diameter and inserting the first metallic tube into the machined intermediate article..

In another embodiment, the present invention provides a process of making a superconductive article including forming a composite intermediate article including a first metallic tube having an interior surface and an exterior surface, said interior surface defining an interior hollow cavity, a second metallic tube having an interior surface and an exterior surface, and a layer of superconductive material or superconductive precursor sandwiched between the exterior surface of the first metallic tube and the interior surface of the second metallic tube, reducing the composite intermediate article to a predetermined cross-sectional diameter, removing the ductile material from the internal cavity of the first metallic tube, and, sintering the reduced composite intermediate article at temperatures and for time sufficient for the superconductive material or superconductive precursor to exhibit superconductivity. The process can further include replacing the ductile material from the internal cavity of the first metallic tube with a rigid material after the reducing of the composite intermediate article, and ironing the reduced composite intermediate article having the rigid material within the internal cavity at a time prior to sintering the composite intermediate article. The forming of the composite intermediate article can be accomplished by inserting a rigid mandrel into an internal cavity of a first metallic tube, said tube having an interior surface and an exterior surface, said interior surface defining the interior cavity, forming a layer of either superconductive material or superconductive precursor upon the exterior surface of said first metallic tube, machining the layer of superconductive material or superconductive precursor to a predetermined diameter to form an intermediate article configured for insertion into a second metallic tube having an interior diameter corresponding to the predetermined diameter, replacing the rigid mandrel with a ductile material at a time after forming the superconductive material or superconductive precursor layer and at a time prior to a reducing stage, and inserting the machined intermediate article into a second metallic tube having an internal diameter corresponding to the predetermined diameter of the intermediate article to form the composite intermediate article or by forming a layer of superconductive material or precursor upon the interior surface of the second metallic tube, machining the layer of superconductive material or precursor to a predetermined diameter to form an intermediate article configured for insertion of the first metallic tube having an exterior diameter corresponding to the predetermined diameter and inserting the first metallic tube into the machined intermediate article.

In still another embodiment, the present invention provides a process of making a superconductive article including forming a composite intermediate article including a first metallic tube having an interior surface and an exterior surface, said interior surface defining an interior hollow cavity, a second metallic tube having an interior surface and an exterior surface, and a layer of superconductive material or superconductive precursor sandwiched between the exterior surface of the first metallic tube and the interior surface of the second metallic tube, reducing the composite intermediate article to a predetermined cross-sectional diameter, and, sintering the reduced composite intermediate article at temperatures and for time sufficient for the superconductive material or superconductive precursor to exhibit superconductivity. The process can further include inserting a rigid mandrel into the internal cavity of the reduced composite intermediate article after the reducing of the composite intermediate article, and ironing the reduced composite intermediate article having the rigid material within the internal cavity at a time prior to sintering the composite intermediate article. The forming of the composite intermediate article can be accomplished by inserting a rigid mandrel into an internal cavity of a first metallic tube, said tube having an interior surface and an exterior surface, said interior surface defining the interior cavity, forming a layer of either superconductive material or superconductive precursor upon the exterior surface of said first metallic tube, machining the layer of superconductive material or superconductive precursor to a predetermined diameter to form an intermediate article configured for insertion into a second metallic tube having an interior diameter corresponding to the predetermined diameter, removing the rigid mandrel from the internal cavity at a time after forming the superconductive material or superconductive precursor layer and at a time prior to a reducing stage, and inserting the machined intermediate article into a second metallic tube having an internal diameter corresponding to the predetermined diameter of the intermediate article or by forming a layer of superconductive material or precursor upon the interior surface of the second metallic tube, machining the layer of superconductive material or precursor to a predetermined diameter to form an intermediate article configured for insertion of the first metallic tube having an exterior diameter corresponding to the predetermined diameter and inserting the first metallic tube into the machined intermediate article or by forming a layer of superconductive material or precursor upon the interior surface of the second metallic tube, machining the layer of superconductive material or precursor to a predetermined diameter to form an intermediate article configured for insertion of the first metallic tube having an exterior diameter corresponding to the predetermined diameter and inserting the first metallic tube into the machined intermediate article.

DETAILED DESCRIPTION

Figure 1:
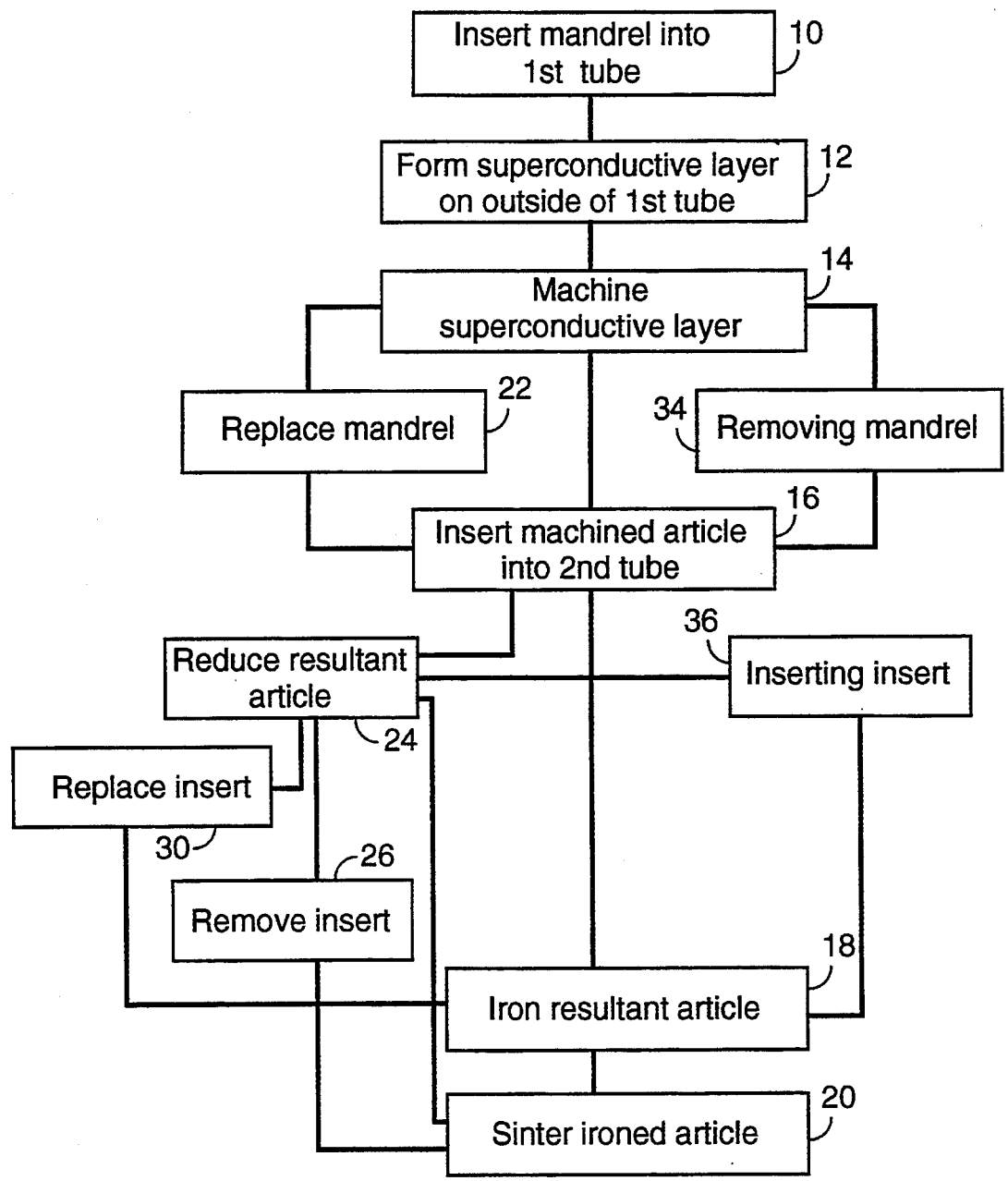
FIG. 1 is a flow sheet illustrating the various steps of the process in the=present invention.

The present invention concerns a superconductive article, e.g., a superconductive wire or tape, and processes of preparing such a superconductive article. The resultant superconductive article prepared by the processes of the present invention has a tubular or cylindrical-type geometry whereby such a superconductive article has a reduced field dependency and increased crack resistance. Additionally, the tubular or cylindrical-type geometry can provide an internal channel or cavity for passage of cryogenic coolant through the inside of the superconductive article.

The present superconductive article can include low temperature superconductive material or high temperature superconductive material, preferably a high temperature superconductive material such as a high temperature superconductive ceramic material. By "low temperature" is generally meant that such a material exhibits superconductivity at temperatures below about 35K. Exemplary of such low temperature superconductive materials are alloys of niobium-tin and niobium-titanium. By "high temperature" is generally meant that such a material exhibits superconductivity at temperatures above about 35K, and preferably exhibits superconductivity at the temperature of liquid nitrogen, about 78K.

In preparing the superconductive article of the present invention, such superconductive article including high temperature superconductive ceramic material, superconductive powder can be prepared, e.g., from bismuth-based superconductive materials such as a bismuth-strontium-calcium-copper oxide, e.g., $Bi_2Sr_2Ca_2Cu_3O_x$ or $Bi_2Sr_2Ca_1Cu_2O_x$, or a bismuth-lead-strontium-calcium-copper oxide, e.g., $(Bi_{2-x}Pb_x)Sr_2Ca_2Cu_3O_x$, from rare earth-based superconductive materials including, e.g., yttrium-based superconductive materials such as a yttrium-barium-copper oxide, e.g., $YBa_2Cu_3O_x$, or from thallium-based superconductive materials such as a thallium-barium-calcium-copper oxide, e.g., $Tl_2Ba_2Ca_2Cu_3O_x$.

Numerous other superconductive compositions are well known as exemplified by $MBa_2Cu_3O_x$ where M is Nd, Dy, Er, Tm, Gd, Sm, Eu, Yb, Ho or mixtures thereof, $La_{2-x}Sn_xCuO_4$, $La_2CuO_4$ doped with fluorine, $YBa_2Cu_3O_x$ doped with fluorine, $EuBa_2(Cu_{1-y}M_y)_3O_x$ where M is Cr, Mn, Fe, Co, Ni or Zn, and $BaKBiO_3$. Those acquainted with the art will appreciate that the list of superconductors, especially high temperature ceramic-type superconductors, is long and continues to grow on a regular basis and that basic high temperature ceramic-type superconductor compositions may generally be doped with various metals, metalloids and nonmetals. The purpose of the present invention is to provide processes of forming or incorporating any general superconductive material and in particular high temperature ceramic-type superconductive materials into desirable configurations with advantageous properties.

Superconductive powder can be prepared from the superconductive material by, e.g., initially conditioning the superconductive powder by pressing the powder under about 10,000 pounds per square inch (PSI) to about 30,000 PSI, crushing the pressed material and passing the resultant material through appropriate sized screens to separate a fine powder of, e.g., from about −4 mesh to about −100 mesh, preferably about −30 mesh.

Superconductive precursor material may also be used in the process of the present invention. By "superconductive precursor material" it is generally meant mixtures of phases which when sintered form the desired superconductor. For example, a mixture of $Bi_2Sr_2Ca_{1-}Cu_2O_x$, of an alkaline earth plumbate such as $Ca_2PbO_4$, and of an alkaline earth cuprate such as $Ca_2CuO_3$ can be mixed together as a superconductive precursor mixture.

In another embodiment, previously formed superconductive wires or tapes may also be used as the superconductive material that is used in forming the layer of superconductive material about the exterior surface of the first metal tube. For example, preformed superconductive wires of $Bi_2Sr_2Ca_2Cu_3O_x$ may be laid or pressed upon the exterior surface of the first tube and then machined and processed as described for powders.

In one process of the present invention, a first metallic tube of, e.g., silver, is preferably filled with a rigid material, e.g., a rigid steel rod can be inserted to serve as a mandrel during the forming of a superconductive layer upon the exterior surface of the first tube, such forming carried out, e.g., by pressing. The superconductive powder of, e.g., −30 mesh, can then be formed into a layer onto the exterior surface of the tube. In a preferred embodiment of the present invention, a layer of superconductive material is formed onto the exterior surface of the tube by cold isostatic pressing of superconductive powder or superconductive precursor powder. Optionally, the superconductive material can be formed by hot pressing or other suitable means. While the dimensions of the first metallic tube are generally limited only by the cross-sectional reducing stage that follows, the first tube is generally from about 1 millimeter (mm) internal diameter (ID) to about 1 meter ID, preferably from about 1 mm ID to about 10 centimeter (cm) ID, with typical tube wall thicknesses of from about 0.1 millimeter to about 10 millimeters. Generally, a layer of superconductive powder or superconductive precursor powder formed, e.g., pressed, upon the first metallic tube will be from about 0.1 millimeters to about 30 millimeters in thickness, preferably from about 0.1 millimeters to about 5 millimeters in thickness. In addition to metallic tubes of silver, the tube may be of a silver-based alloy, gold or a gold-based alloy as well as a gold- or a silver-plated metal. Such metallic tubes must not react with the superconductive material and in some cases must allow oxygen permeation through the tube wall during any sintering or annealing stages. While the tubes generally preferred in the present process will be essentially cylindrical in circumference, other shaped tubes than cylindrical may be used if desired.

A resultant intermediate article is thus formed, such an intermediate article including the layer of superconductive material or superconductive precursor upon the first metallic tube. This intermediate article can then be machined to obtain desired predetermined dimensions corresponding to the internal diameter of a second metallic tube.

The second metallic tube of, e.g., silver, has an internal diameter corresponding to the machined diameter of the superconductive powder coated first tube, generally from about 1.2 mm to about 18 mm. As with the first metallic tube, the second metallic tube must not react with the superconductive material and in some cases must allow oxygen permeation through the tube wall during any sintering or annealing stages. Silver-based alloys, gold and gold-based alloys may be used as the second tube as well as gold- or silver-plated metals.

In another process of the present invention, the superconductive powder of, e.g., −30 mesh, can be formed onto the interior surface of the second metallic tube, i.e., the tube having the greater diameter, by cold isostatic pressing. The layer of superconductive material or precursor will generally be about the same thickness as when such a layer is formed upon the exterior of the first metallic tube described above. This resultant intermediate article including the layer of superconductive material or superconductive precursor upon the interior of the second metallic tube can then be machined to obtain desired predetermined dimensions corresponding to the outer or external diameter of the first metallic tube. The first metallic tube having the proper corresponding diameter can then be inserted into the above described intermediate article to form a composite intermediate article for further processing.

After the composite intermediate article including the layer of superconductive material or superconductive precursor is formed, the resultant composite intermediate article is then reduced in cross-section, e.g., by drawing, rolling, swaging, extruding or combinations thereof, down to a desired dimension or internal diameter. Prior to such a drawing step, the rigid insert is removed and generally replaced with a ductile material. Optionally, the composite intermediate article can be initially subjected to an ironing process, i.e., a cross-section reducing process wherein the ID remains essentially constant but the OD is reduced.

An ironing stage is believed to help in aligning or texturing the superconductive material or superconductive precursor between the two tube walls. Such ironing is also believed to produce a higher hydrostatic compressive stress which may be beneficial by helping in densification of the superconductive material or superconductive precursor and may reduce any tendency to crack during fabrication.

Various combinations of cross-section reducing, e.g., drawing and ironing steps are possible in obtaining the resultant superconductive articles with the desired dimensions.

Generally, the rigid insert or ductile material is eventually removed from the interior of the first or inner tube whereby the resultant superconductive article includes a cavity situated within the body of the superconductive article. This cavity can allow for the passage of an appropriate cryogenic coolant, e.g., liquid nitrogen or liquid helium, through the superconductive article. In another embodiment, a rigid high-strength tube or rod can be inserted into the internal cavity or core thereby assisting in mechanical stabilization or support of the resultant wire or tape. Such a rigid high-strength tube or rod does not necessarily occupy the entire cavity thereby still permitting the passage of cryogenic coolant.

The superconductive properties of the superconductive material or superconductive precursor are provided or enhanced by sintering or annealing the finally drawn or ironed superconductive article. Such sintering or annealing can generally be accomplished by heating the superconductive article under an oxygen-containing atmosphere at temperatures from about 650° C. to about 850° C. for periods of time from about 1 hour to about 200 hours. Optionally, the composite intermediate article can be sintered, followed by additionally drawing or ironing, and followed by still further sintering or annealing. In one embodiment of the invention, a ceramic insert of, e.g., alumina, is inserted within the inner cavity during sintering to maintain the desired shape of the resultant article by reducing any sagging.

Referring to FIG. 1, the process of preparing the superconductive article includes inserting a rigid mandrel into an internal cavity of a first metallic tube as shown at 10, followed by forming a layer of superconductive material or superconductive precursor upon the exterior surface of the first metallic tube as shown at 12. Optionally, the layer of superconductive material or superconductive precursor can be formed upon the exterior of a hollow first metallic tube, i.e., a tube without the rigid mandrel insert. The layer of superconductive material or superconductive precursor, upon the exterior surface of the first tube, is then machined to a predetermined diameter as shown at 14. The machining of the superconductive material or superconductive precursor results in the formation of a first intermediate article, such intermediate article being configured for insertion into a second metallic tube. Preferably, the second metallic tube has an interior diameter corresponding to the predetermined diameter. The resultant machined intermediate article is then inserted into the second metallic tube as shown at 16 thereby forming a composite intermediate article. At this point, the composite intermediate article includes the rigid mandrel within the internal cavity of the first metallic tube. The composite intermediate article then undergoes ironing as shown at 18 whereby the internal diameter of the resultant article will be maintained in size as the first and second metallic tube walls having the superconductive material or superconductive precursor sandwiched therebetween are reduced in thickness and a texturing or aligning or densification of the superconductive material or superconductive precursor can occur. Finally, the ironed composite intermediate article is sintered as shown at 20 to provide or enhance the superconductive properties in the resultant article. The final superconductive article including the internal cavity is obtained by removal of the material within the cavity of the original first tube.

In another embodiment, the process of preparing the superconductive article includes inserting a rigid mandrel into an internal cavity of a first metallic tube as shown at 10, followed by forming a layer of superconductive material or superconductive precursor upon the exterior surface of the first metallic tube as shown at 12. The layer of superconductive material or superconductive precursor upon the exterior surface of the first tube, is then machined to a predetermined diameter as shown at 14. The machining of the superconductive material or superconductive precursor results in the formation of a first intermediate article, such intermediate article being configured for insertion into a second metallic tube. Preferably, the second metallic tube has an interior diameter corresponding to the predetermined diameter. Generally, prior to inserting the first intermediate article into the second tube, the rigid mandrel is replaced with a ductile material as shown at 22, although optionally, the rigid mandrel can be replaced with a ductile material at any time prior to a cross-section reduction. The resultant ductile material-containing article is then inserted into the second metallic tube as shown at 16 thereby forming a composite intermediate article. The composite intermediate article then undergoes cross-section reducing, e.g., drawing, as shown at 24 whereby both the internal diameter and outer diameter of the resultant article will be reduced. After the cross-section reduction, the ductile material is removed as shown at 26, although optionally the ductile material can be removed after the final sintering. Optionally, the ductile material can be replaced with a rigid insert as shown at 30 and an ironing process as previously described can be employed as shown at 18. Finally, the reduced composite intermediate article is sintered as shown at 20 to provide or enhance the superconductive properties in the resultant article. Again, the final superconductive article including the internal cavity is obtained by removal of the material within the cavity of the original first tube.

In still another embodiment, the process of preparing the superconductive article includes inserting a rigid mandrel into an internal cavity of a first metallic tube as shown at 10, followed by forming a layer of superconductive material or superconductive precursor upon the exterior surface of the first metallic tube as shown at 12. The layer of superconductive material or superconductive precursor upon the exterior surface of the first tube, is then machined to a predetermined diameter as shown at 14. The machining of the superconductive material or superconductive precursor results in the formation of a first intermediate article, such intermediate article being configured for insertion into a second metallic tube. Preferably, the second metallic tube has an interior diameter corresponding to the predetermined diameter. Generally, prior to inserting the first intermediate article into the second tube, the rigid mandrel is removed as shown at 34, although optionally, the rigid mandrel can be removed at any time prior to a cross-section reduction. The resultant article including the internal cavity is then inserted into the second metallic tube as shown at 16 thereby forming a composite intermediate article. The composite intermediate article then undergoes cross-section reducing, e.g., drawing, as shown at 24 whereby both the internal diameter and outer diameter of the resultant article will be reduced. After the cross-section reduction, a rigid material can be inserted into the internal cavity as shown at 36 and an ironing process as previously described can be employed as shown at 18. Finally, the reduced composite intermediate article is sintered as shown at 20 to provide or enhance the superconductive properties in the resultant article. Again, the final superconductive article including the internal cavity is obtained by removal of the material within the cavity of the original first tube.

Figure 2:
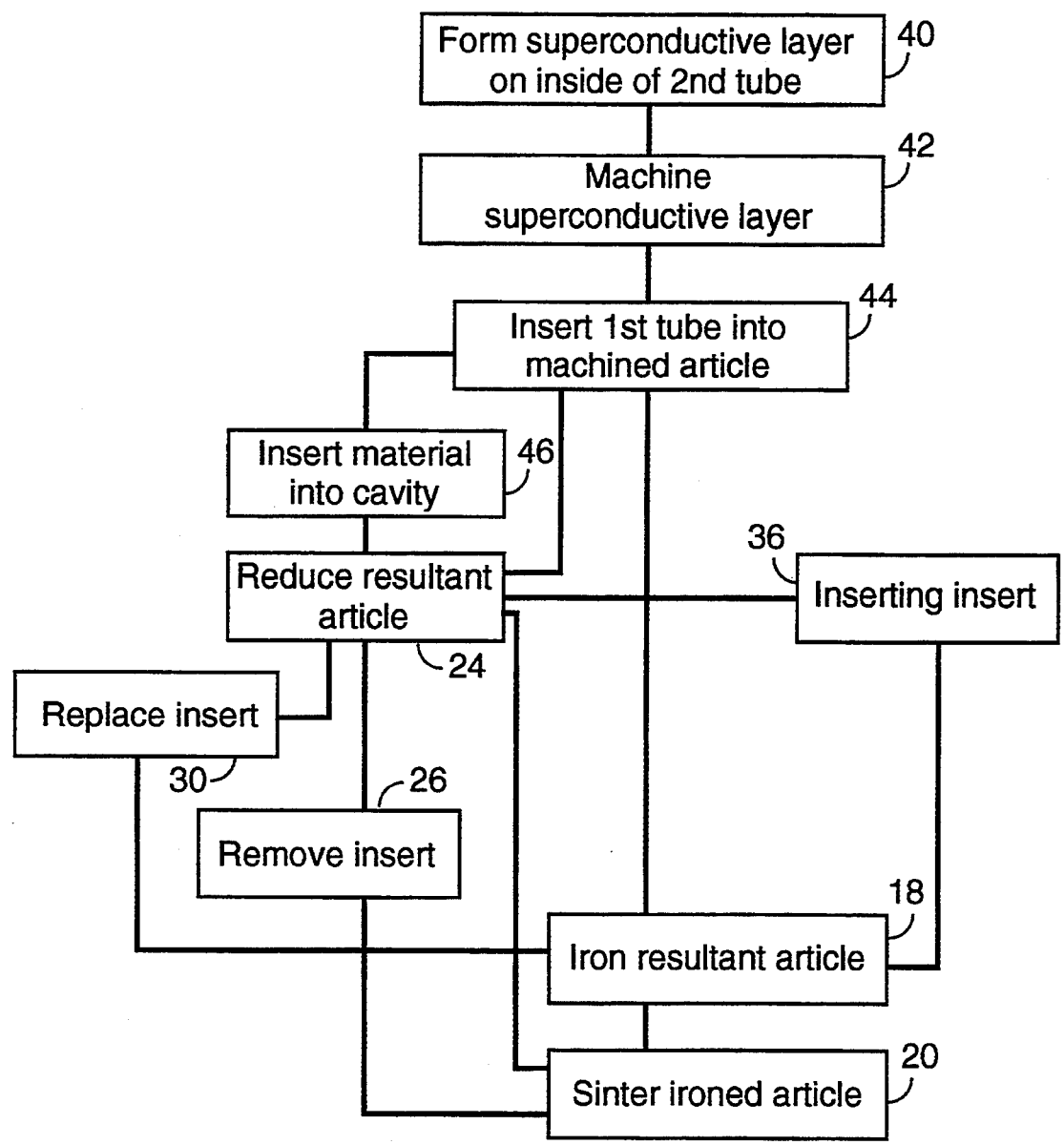
FIG. 2 is a flow sheet illustrating various optional steps of the process in the present invention.

Referring to FIG. 2, the process of preparing the superconductive article includes forming a layer of superconductive material or superconductive precursor upon the interior surface of the second metallic tube as shown at 40. The layer of superconductive material or superconductive precursor, upon the interior surface of the second tube, is then machined to a predetermined diameter as shown at 42. The machining of the superconductive material or superconductive precursor results in the formation of an intermediate article, such intermediate article being configured for insertion of a first metallic tube into the second metallic tube having the machined superconductive layer on the interior surface. The first metallic tube has an exterior diameter corresponding to the predetermined diameter. The resultant machined intermediate article is then inserted into the second metallic tube as shown at 44 thereby forming a composite intermediate article. The resultant composite intermediate article can then undergo ironing as shown at 18 whereby the internal diameter of the resultant article will be maintained in size as the first and second metallic tube walls having the superconductive material or superconductive precursor sandwiched therebetween are reduced in thickness and a texturing or aligning or densification of the superconductive material or superconductive precursor can occur. Then, the ironed composite intermediate article can be sintered as shown at 20 to provide or enhance the superconductive properties in the resultant article. The final superconductive article including the internal cavity is obtained by removal of the material within the cavity of the original first tube.

In another embodiment, the process of preparing the superconductive article includes inserting a ductile material into the cavity of the resultant article prepared in blocks 40, 42 and 44, such insertion of ductile material shown at 46, followed by cross-section reducing, e.g., drawing, as shown at 24 whereby both the internal diameter and outer diameter of the resultant article will be reduced. After the cross-section reduction, the ductile material is removed as shown at 26, although optionally the ductile material can be removed after the final sintering. Optionally, the ductile material can be replaced with a rigid insert as shown at 30 and an ironing process as previously described can be employed as shown at 18. Finally, the reduced composite intermediate article is sintered as shown at 20 to provide or enhance the superconductive properties in the resultant article. Again, the final superconductive article including the internal cavity is obtained by removal of the material within the cavity of the original first tube.

The present invention is more particularly described in the following example which is intended as illustrative only, since numerous modifications and variations will be apparent to those skilled in the art.

EXAMPLE 1

A superconductive powder of bismuth-lead-strontium-calcium-copper oxide with the composition $(Bi_{1.8}Pb_{0.4})Sr_2Ca_{2.2}Cu_{3.1}O_{10}$ was initially prepared for preparation of the superconductive wire. A precursor of $Sr_2Ca_{2.2}Cu_{3.1}O_x$ was initially prepared by sintering a mixture of $SrCO_3$, $CaCO_3$, and $CuO$ at about 950° C. for about 100 hours under a flowing atmosphere of oxygen at about 40 cubic centimeters per minute (cc/min). A mixture of this precursor, $Bi_2O_3$, and $PbO$ was sintered in air at 870° C. over about 100 hours with two intermediate grindings in order to produce the superconductive powder. The resultant powder was examined by x-ray powder diffraction and shows a single phase material. Additionally, the resultant powder had a superconducting transition temperature of 110K.

The superconductive powder was pre-conditioned by cold isostatic pressing at 30,000 PSI, followed by grinding and screening to obtain a $-30$ mesh powder. A silver tube having a 10.80 mm inner diameter (ID) and a 12.83 mm outer diameter (OD) was crimped at one end and filled with molten lead. The tube was capped with a rubber stopper and placed in a pressing sack. The pressing sack was filled with 59.8 g of the $-30$ mesh superconductive powder and the other end of the tube capped with a second rubber stopper. The superconductive powder was then pressed upon the outside surface of the silver tube by cold isostatic pressing at 30,000 PSI. The silver tube including the pressed layer of superconductive powder was removed from the pressing sack and machined dry on a lathe to trim the pressed powder layer to a size that would snugly fit into a second silver tube having a 14.88 mm ID and a 16.89 mm OD. After machining, first resultant assembly was inserted into the second tube.

The composite assembly including the inner tube filled with lead and coated with the superconductive powder and the outer tube was then swaged at both ends to permit subsequent drawing, then drawn, i.e., reduced in cross-section, to a 0.425 inch OD and a 0.25 inch ID by drawing through multiple drawing dies. At this point the composite assembly was divided into two pieces. The lead filling was removed from the first piece by melting and a 0.25 inch diameter hardened tool steel rod was inserted into the internal cavity of the original silver tube. The rod served as a mandrel for ironing of the first piece to a 0.392 inch OD while maintaining the 0.25 inch ID. The rod was then removed leaving a hollow composite article, i.e., a tubular shaped article with an internal cavity. The second piece was subjected to continued drawing through dies to a 0.196 inch OD and about a 0.125 inch ID at which time the lead filling was removed by melting. A 0.125 inch diameter hardened tool steel rod coated with a boron nitride spray lubricant was inserted into the internal cavity of the original silver tube, such rod again serving as a mandrel for ironing. The second piece was then ironed to a 0.180 inch OD while maintaining the 0.125 inch ID. The rod was then removed to produce the hollow tubular shaped composite article.

The resultant pieces were then subjected to sintering in an atmosphere of air at a temperature of about 840° C. for about 100 hours. The resultant composite articles were then measured for superconductivity by magnetic susceptibility which indicated a superconducting transition temperature of about 110K.

Although the present invention has been described with reference to specific details, it is not intended that such details should be regarded as limitations upon the scope of the invention, except as and to the extent that they are included in the accompanying claims.

What is claimed is:

1. A process of making a superconductive article comprising:
   forming a composite intermediate article including a first solid metallic tube having an interior surface and an exterior surface, said interior surface defining an interior hollow cavity, a second solid metallic tube having an interior surface and an exterior surface, and a layer of powder material selected from the group consisting of superconductive material and superconductive precursor material sandwiched between the exterior surface of the first solid metallic tube and the interior surface of the second solid metallic tube, with the proviso that the powder material is non-reactive with said solid metallic tubes, said forming by the steps of inserting a rigid mandrel into the interior hollow cavity of the first solid metallic tube, forming a layer of powder material selected from the group consisting of superconductive material and superconductive precursor material upon the exterior surface of said first solid metallic tube, machining the layer of powder material selected from the group consisting of superconductive material and superconductive precursor material to a predetermined diameter to form an intermediate article configured for insertion into the second solid metallic tube having an internal diameter corresponding to the predetermined diameter, and inserting the machined intermediate article into the second solid metallic tube having an internal diameter corresponding to the predetermined diameter of the intermediate article to form the composite intermediate article, said cavity of said composite intermediate article further characterized as substantially free of material selected from the group of superconductive material and superconductive precursor material;

ironing the composite intermediate article to a predetermined cross-sectional diameter; and, sintering the ironed composite intermediate article at temperatures and for time sufficient for the layer of powder material selected from the group consisting of superconductive material and superconductive precursor material to exhibit superconductivity.

2. The process of claim 1 wherein the first and second metallic tubes are silver.

3. A process of making a superconductive article comprising:

forming a composite intermediate article including a first solid metallic tube having an interior surface and an exterior surface, said interior surface defining an interior hollow cavity, a second solid metallic tube having an interior surface and an exterior surface, and a layer of powder material selected from the group consisting of superconductive material and superconductive precursor material sandwiched between the exterior surface of the first solid metallic tube and the interior surface of the second solid metallic tube, with the proviso that the powder material is non-reactive with said solid metallic tubes, said forming by the steps of forming a layer of powder material selected from the group consisting of superconductive material and superconductive precursor material upon the interior surface of said second solid metallic tube, machining the layer of powder material selected from the group consisting of superconductive material and superconductive precursor material to a predetermined diameter to form an intermediate article configured for insertion of said first solid metallic tube having an external diameter corresponding to the predetermined diameter, and inserting the first solid metallic tube having an external diameter corresponding to the predetermined diameter into the machined intermediate article to form the composite intermediate article, said cavity of said composite intermediate article further characterized as substantially free of material selected from the group of superconductive material and superconductive precursor material;

ironing the composite intermediate article to a predetermined cross-sectional diameter; and, sintering the ironed composite intermediate article at temperatures and for time sufficient for the layer of powder material selected from the group consisting of superconductive material and superconductive precursor material to exhibit superconductivity.

4. A process of making a superconductive article comprising:

forming a composite intermediate article including a first solid metallic tube having an interior surface and an exterior surface, said interior surface defining an interior hollow cavity, a second solid metallic tube having an interior surface and an exterior surface, and a layer of powder material selected from the group consisting of superconductive material and superconductive precursor material sandwiched between the exterior surface of the first solid metallic tube and the interior surface of the second solid metallic tube, with the proviso that the powder material is non-reactive with said solid metallic tubes, wherein said forming a composite intermediate article including a layer of powder material includes cold isostatic pressing of the powder material selected from the group consisting of superconductive material and superconductive precursor material upon the exterior surface of the first solid metallic tube, said cavity of said composite intermediate article further characterized as substantially free of material selected from the group of superconductive material and superconductive precursor material;

ironing the composite intermediate article to a predetermined cross-sectional diameter; and, sintering the ironed composite intermediate article at temperatures and for time sufficient for the layer of powder material selected from the group consisting of superconductive material and superconductive precursor material to exhibit superconductivity.

5. A process of making a superconductive article comprising:

forming a composite intermediate article including a first solid metallic tube having an interior surface and an exterior surface, said interior surface defining an interior hollow cavity, a second solid metallic tube having an interior surface and an exterior surface, and a layer of powder material selected from the group consisting of superconductive material and superconductive precursor material sandwiched between the exterior surface of the first solid metallic tube and the interior surface of the second solid metallic tube, with the proviso that the powder material is non-reactive with said solid metallic tubes, wherein said forming a composite intermediate article comprises inserting a rigid mandrel into the interior hollow cavity of the first solid metallic tube, forming a layer of powder material selected from the group consisting of superconductive material and superconductive precursor material upon the exterior surface of said first solid metallic tube, machining the layer of powder material selected from the group consisting of superconductive material and superconductive precursor material to a predetermined diameter to form an intermediate article configured for insertion into the second solid metallic tube having an internal diameter corresponding to the predetermined diameter, replacing the rigid mandrel with a ductile material at a time after forming the layer of powder material selected from the group consisting of superconductive material and superconductive precursor material and at a time prior to a reducing stage, and inserting the machined article into the second solid metallic tube having an internal diameter corresponding to the predetermined diameter of the intermediate article to form the composite intermediate article, said cavity of said composite intermediate article further characterized as substantially free of material selected from the group of superconductive material and superconductive precursor material;

reducing the ID and OD of the composite intermediate article to predetermined cross-sectional diameters;

removing the ductile material from the interior hollow cavity; and, sintering the reduced composite intermediate article at temperatures and for time sufficient for the layer of powder material selected from the group consisting of superconductive material and superconductive precursor material to exhibit superconductivity.

6. The process of claim 5 wherein the first and second metallic tubes are silver.

7. The process of claim 5 wherein said ductile material is a low-melting metal or alloy.

8. The process of claim 5 wherein the cross-sectional diameters of the composite intermediate article are reduced by drawing.

9. A process of making a superconductive article comprising:

forming a composite intermediate article including a first solid metallic tube having an interior surface and an exterior surface, said interior surface defining an interior hollow cavity, a second solid metallic tube having an interior surface and an exterior surface, and a layer of powder material selected from the group consisting of superconductive material and superconductive precursor material sandwiched between the exterior surface of the first solid metallic tube and the interior surface of the second solid metallic tube, with the proviso that the powder material is non-reactive with said solid metallic tubes, wherein said forming a composite intermediate article comprises forming a layer of powder material selected from the group consisting of superconductive material and superconductive precursor material upon the interior surface of said second solid metallic tube, machining the layer of powder material selected from the group consisting of superconductive material and superconductive precursor material to a predetermined diameter to form an intermediate article configured for insertion of said first solid metallic tube having an external diameter corresponding to the predetermined diameter, and inserting the first solid metallic tube having an external diameter corresponding to the predetermined diameter into the machined intermediate article to form the composite intermediate article, said cavity of said composite intermediate article further characterized as substantially free of material selected from the group of superconductive material and superconductive precursor material;

placing a ductile material into the interior cavity of the first solid metallic tube;

reducing the ID and OD of the composite intermediate article to predetermined cross-sectional diameters;

removing the ductile material from the interior hollow cavity; and, sintering the reduced composite intermediate article at temperatures and for time sufficient for the layer of powder material selected from the group consisting of superconductive material and superconductive precursor material to exhibit superconductivity.

10. A process of making a superconductive article comprising:

forming a composite intermediate article including a first solid metallic tube having an interior surface and an exterior surface, said interior surface defining an interior hollow cavity, a second solid metallic tube having an interior surface and an exterior surface, and a layer of powder material selected from the group consisting of superconductive material and superconductive precursor material sandwiched between the exterior surface of the first solid metallic tube and the interior surface of the second solid metallic tube, with the proviso that the powder material is non-reactive with said solid metallic tubes, wherein said forming a composite intermediate article including a layer of powder material includes cold isostatic pressing of the powder material selected from the group consisting of superconductive material and superconductive precursor material upon the exterior surface of the first solid metallic tube, said cavity of said composite intermediate article further characterized as substantially free of material selected from the group of superconductive material and superconductive precursor material;

placing a ductile material into the interior hollow cavity of the first solid metallic tube;

reducing the ID and OD of the composite intermediate article to predetermined cross-sectional diameters;

removing the ductile material from the interior hollow cavity; and, sintering the reduced composite intermediate article at temperatures and for time sufficient for the layer of powder material selected from the group consisting of superconductive material and superconductive precursor material to exhibit superconductivity.

11. A process of making a superconductive article comprising:

forming a composite intermediate article including a first solid metallic tube having an interior surface and an exterior surface, said interior surface defining an interior hollow cavity, a second solid metallic tube having an interior surface and an exterior surface, and a layer of powder material selected from the group consisting of superconductive material and superconductive precursor material sandwiched between the exterior surface of the first solid metallic tube and the interior surface of the second solid metallic tube, with the proviso that the powder material is non-reactive with said solid metallic tubes, wherein said forming a composite intermediate article comprises inserting a rigid mandrel into the interior hollow cavity of the first solid metallic tube, forming a layer of powder material selected from the group consisting of superconductive material and superconductive precursor material upon the exterior surface of said first solid metallic tube, machining the layer of powder material selected from the group consisting of superconductive material and superconductive precursor material to a predetermined diameter to form an intermediate article configured for insertion into the second solid metallic tube having an internal diameter corresponding to the predetermined diameter, removing the rigid mandrel from the interior hollow cavity at a time after forming the layer of powder material selected from the group consisting of superconductive material and superconductive precursor material and at a time prior to a reducing stage, and inserting the intermediate article into the second solid metallic tube having an internal diameter corresponding to the predetermined diameter of the intermediate article to form the composite intermediate article, said cavity of said composite intermediate article further characterized as substantially free of material selected from the group of superconductive material and superconductive precursor material; and, reducing the ID and OD of the composite intermediate article to predetermined cross-sectional diameters;

sintering the reduced composite intermediate article at temperatures and for time sufficient for the layer of powder material selected from the group consisting of superconductive material and superconductive precursor material to exhibit superconductivity.

12. The process of claim 11 further comprising:
inserting a rigid mandrel into the internal cavity of the reduced composite intermediate article; and,
ironing the reduced composite intermediate article having the rigid material within the internal cavity at a time prior to the sintering stage.

13. The process of claim 11 wherein the first and second metallic tubes are silver.

14. The process of claim 11 wherein the cross-sectional diameters of the composite intermediate article are reduced by drawing.

15. A process of making a superconductive article comprising:
forming a composite intermediate article including a first solid metallic tube having an interior surface and an exterior surface, said interior surface defining an interior hollow cavity, a second solid metallic tube having an interior surface and an exterior surface, and a layer of powder material selected from the group consisting of superconductive material and superconductive precursor material sandwiched between the exterior surface of the first solid metallic tube and the interior surface of the second solid metallic tube, with the proviso that the powder material is non-reactive with said solid metallic tubes, wherein said forming a composite intermediate article comprises forming a layer of powder material selected from the group consisting of superconductive material and superconductive precursor material upon the interior surface of said second solid metallic tube, machining the layer of powder material selected from the group consisting of superconductive material and superconductive precursor material to a predetermined diameter to form an intermediate article configured for insertion of said first solid metallic tube having an external diameter corresponding to the predetermined diameter, and inserting the first solid metallic tube having an external diameter corresponding to the predetermined diameter into the machined intermediate article to form the composite intermediate article, said cavity of said composite intermediate article further characterized as substantially free of material selected from the group of superconductive material and superconductive precursor material;

reducing the ID and OD of the composite intermediate article to predetermined cross-sectional diameters;

sintering the reduced composite intermediate article at temperatures and for time sufficient for the layer of powder material selected from the group consisting of superconductive material and superconductive precursor material to exhibit superconductivity.

16. A process of making a superconductive article comprising:
forming a composite intermediate article including a first solid metallic tube having an interior surface and an exterior surface, said interior surface defining an interior hollow cavity, a second solid metallic tube having an interior surface and an exterior surface, and a layer of powder material selected from the group consisting of superconductive material and superconductive precursor material sandwiched between the exterior surface of the first solid metallic tube and the interior surface of the second solid metallic tube, with the proviso that the powder material is non-reactive with said solid metallic tubes, wherein said forming a composite intermediate article including a layer of powder material includes cold isostatic pressing of the powder material selected from the group consisting of superconductive material and superconductive precursor material upon the exterior surface of the first solid metallic tube, said cavity of said composite intermediate article further characterized as substantially free of material selected from the group of superconductive material and superconductive precursor material;

reducing the ID and OD of the composite intermediate article to predetermined cross-sectional diameters; and, sintering the reduced composite intermediate article at temperatures and for time sufficient for the layer of powder material selected from the group consisting of superconductive material and superconductive precursor material to exhibit superconductivity.

* * * * *